United States Patent
Krumme et al.

[11] 3,944,992
[45] Mar. 16, 1976

[54] MAGNETO-OPTICAL INFORMATION STORAGE DEVICE USING PHOTOCONDUCTIVE CONTROL ELEMENT

[75] Inventors: Jens-Peter Krumme; Bernhard Hill, both of Hamburg, Germany

[73] Assignee: U.S. Philips Corporation, New York, N.Y.

[22] Filed: Nov. 4, 1974

[21] Appl. No.: 520,533

[30] Foreign Application Priority Data
Nov. 16, 1973 Germany............................ 2357301

[52] U.S. Cl. .............................. 340/174 YC; 360/59
[51] Int. Cl.² ............................................. G11B 5/02
[58] Field of Search ................ 340/174 YC; 360/59; 350/151

[56] References Cited
UNITED STATES PATENTS

| 3,445,826 | 5/1969 | Myers | 340/174 YC |
| 3,631,415 | 12/1971 | Aagard | 340/174 YC |
| 3,781,905 | 12/1973 | Bernal et al. | 360/59 |
| 3,859,643 | 1/1975 | Borrelli | 340/174 YC |

*Primary Examiner*—Vincent P. Canney
*Attorney, Agent, or Firm*—Frank R. Trifari; Carl P. Steinhauser

[57] ABSTRACT

The invention relates to a device for magneto-optic memories controlled by light and/or heat in an external magnetic field, in which the magneto-optic material of the memory has a photoconductive layer which can be activated by the control beam and which can be controlled by means of electrodes provided thereon via a current or voltage source.

10 Claims, 3 Drawing Figures

MAGNETO-OPTICAL INFORMATION STORAGE DEVICE USING PHOTOCONDUCTIVE CONTROL ELEMENT

The invention relates to an information storage device having a storage plate of a magneto-optic material which can be controlled by means of a light beam.

The use of magneto-optic memory materials, for example, manganese-bismuth or iron garnet, in the form of thin films for the erasable storage of optically presented information in optic memory systems is known (I.E.E.E. Trans. Mag-9,66 (1973): MnBi films for magneto-optic recording: Appl. Phys. Lett. 20, 451 (1972): Thermomagnetic recording in thin garnet layers). The storage material is magnetized at right angles to the storage plane in a positive or in a negative direction. A given information state corresponds to a given distribution of the magnetization in the layer; for example, a region magnetized in a positive direction represents a binary information unit "1", whereas a region magnetized in the reverse direction represents a binary "0", or conversely.

The storage material is divided into a large number of magnetic domains, the storage sites, the magnetization state of which represents the information state. In practice the cross-section of a storage site is between 1 and 10 $\mu$m. So storage densities of $10^6$ bits/cm$^2$ or more are reached.

The recording of information occurs by directing a focused laser beam on a storage site. The storage material is heated by the absorbed light energy in the region of the exposed zone. The heating produces a considerable reduction of the anisotropy field in the exposed region. The stability of the direction of the magnetization present thereby becomes smaller. This enables the reversal of the direction of magnetization in the exposed regions by the short-lasting switching-on of an external magnetic field. In practice there will be operated mainly in the proximity of the Curie temperature (for example, in manganese-bismuth). The local thermomagnetic switching may also take place advantageously in the proximity of the compensation temperature (for example, in garnet materials). After switching-off the laser beam, a new magnetization direction with great stability adjusts upon cooling. Due to the small size of a storage site, said process of heating and cooling must take place very rapidly in order that a reversal of the magnetization in a storage site be reached before the supplied thermal energy has flowed away to adjacent regions. In materials which are useful in practice, for example, in iron garnet materials, said time for the envisaged size of a storage site lies below 10 $\mu$sec. A characteristic value of the energy to be supplied is 0.1 to 1 Erg per storage site to obtain the desired temperature increase. This involves that for recording information in a storage site, for example, within 1 $\mu$sec a laser power of at least 10–100mW is required. It is endeavoured in practical memory systems to record large quantities of information in a short period of time. This is achieved, for example, by arranging a larger number of storage sites in parallel. It is obvious that in that case, however, due to the required switching power, very large laser powers are necessary which can be supplied only by expensive lasers having a high output power.

It is the object of the present invention to reduce the light energy required for switching known magneto-optic materials. According to the invention this is achieved in that a photoconductive layer is provided on the magneto-optic material of the storage plate, which layer can be activated by the light beam and which can be controlled by means of electrodes provided thereon via a current or voltage source.

By means of a photoconductor as a light-sensitive switching element, the actual energy for switching a storage site is no longer derived from the light energy but from an electric source.

In addition to the increase of the photosensitivity which is possible by using a photoconductor, the particular advantage of the device according to the invention resides in the fact that as a result of the electronic heating the power required for switching need no longer be obtained by absorption of light in the magneto-optic material and hence the composition of the magnetic material can be optimized with a view to a maximum read-out signal, so, for example, in the direction of a light absorption $\alpha$ which is as small as possible with a Faraday effect which is as large as possible (that is to say with a maximum "figure of merit" $F/\alpha$).

Notably this is of particular advantage in Bi-substituted ferrimagnetic garnet fims which for thermomagnetic switching were so far grown in Pb-containing melts, in order to obtain a light absorption which is sufficient for the heating by incorporating Pb. Said layers can now be manufactured without Pb so that the figure of merit is considerably increased.

The invention will now be described in greater detail with reference to the accompanying drawing, in which.

Figure 1:
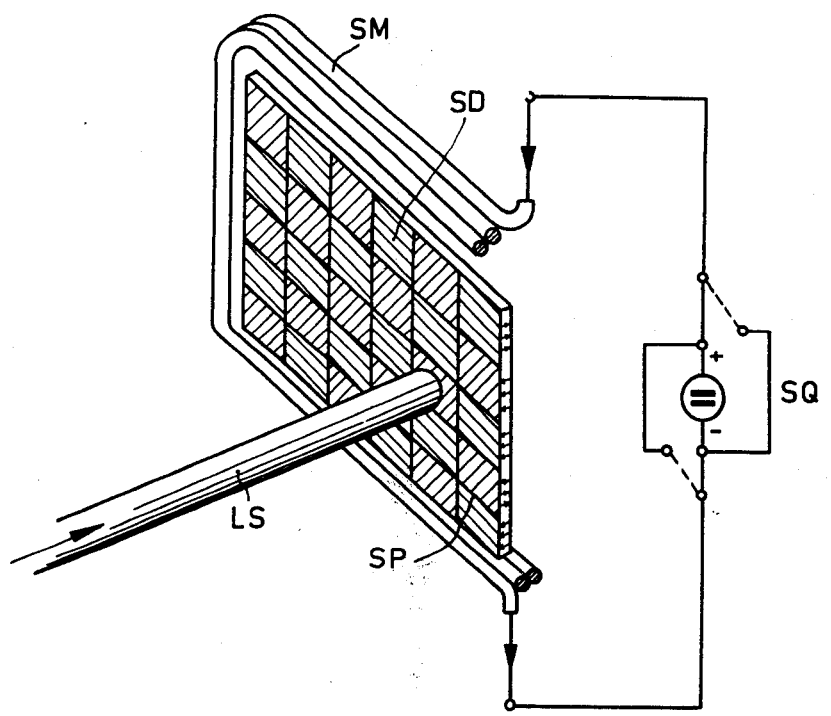
FIG. 1 illustrates a known magneto-optic information storage device.

In the storage device shown in FIG. 1 the magneto-optic storage plate SP is surrounded by a coil SM for generating an external magnetic field. The storage plate SP can be magnetized in the positive or the negative direction dependent on the current direction of the current source SQ.

The laser beam LS directed on a storage site, for example a domain SD, serves to record information. The switching of the direction of magnetization in the exposed regions takes place by means of the magnetic field applied for a short time by the coil SM.

Figure 2:
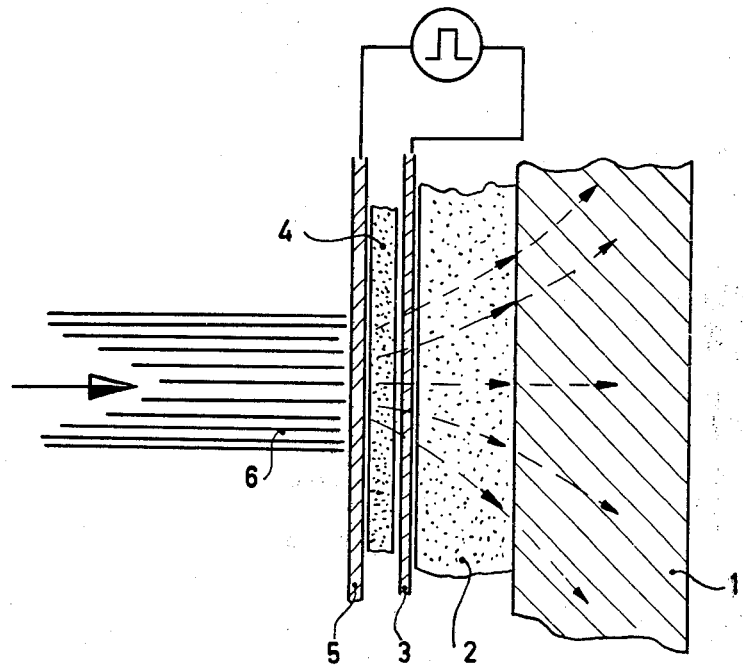
FIGS. 2 and 3 show storage devices with photoconductors according to the invention.

FIG. 2 shows a first embodiment of a storage plate to be used in the device according to the invention. The magneto-optic material 2, for example the said iron garnet, provided on a substrate 1 has a light-permeable electrode 3. On the electrode 3 is present a photoconductor 4, for example of cadmium sulfide, which on its surface is covered with a transparent electrode 5. For switching the magneto-optic material 2 the surface to be switched of the device consisting of several layers is illuminated by a laser beam 6 which can be deflected. As a result of this the photoconductor 4 becomes conductive in the illuminated place. When a voltage is applied to the transparent electrodes 3, 5, a current flows in the photoconductor 4, the strength of which depends upon the irradiated light power. It is assumed that the resistance of the photoconductor 4 in the unexposed condition has such a high value that unexposed zones remain non-conductive. In accordance with the product current times voltage, a power is converted in the photoconductor 4 which results in the rise of the temperature in the photoconductor in the exposed place. Besides by switching with a direct voltage source 7, an effective generation of heat due to energy losses in photoconductors is also possible with an alternating voltage and high frequency voltage, respectively, in particular when, as a result of this, resonance movements of the charge carriers are excited. As a result of this the ratio between electric power and light power can even be increased. The produced thermal energy flows to the adjacent region of the magneto-optic storage material by thermal conductivity so that this is also heated. By means of the applied voltage the generated thermal energy can be adjusted so that a sufficient temperature increase in the storage material 2 is obtained. A short-lasting temperature increase is achieved in that the voltage across the photoconductor 4 is switched on only for a short period of time. The energy for switching the storage material 2 is thus derived from the electric source, the irradiated light being used only as a control parameter. The described device thus combines the storage power of the magneto-optic material with the known photosensitivity of a photoconductor so that information can be recorded with a very low light power.

Figure 3:
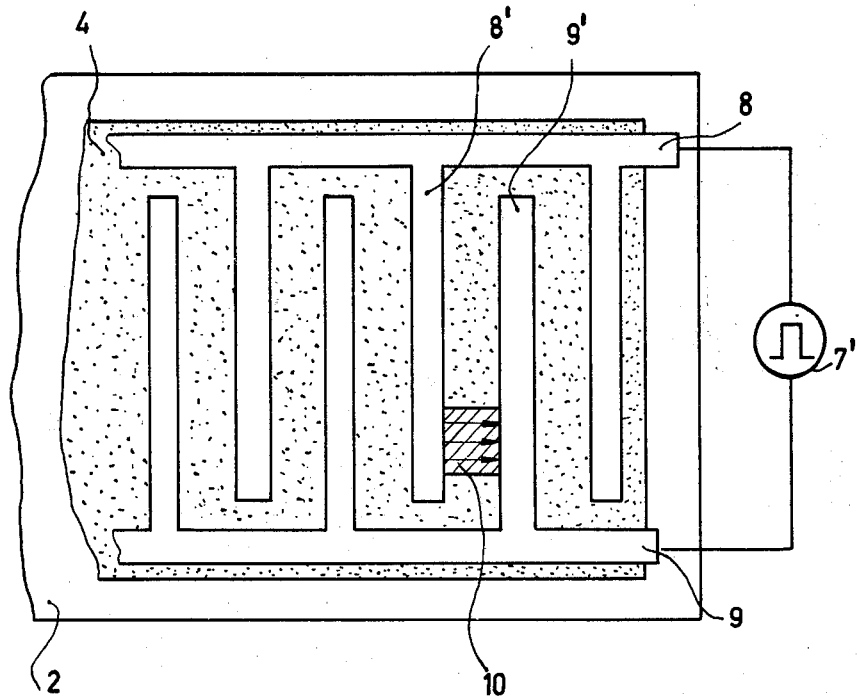

A second embodiment of the storage plate to be used in the device according to the invention is shown in FIG. 3. In this case the magneto-optic material has an interdigitated structure of electrodes 8, 9 which serve to supply the electric energy. The distance between adjacent interdigitated elements 8', 9' should be smaller than the focus diameter of the control beam. The photoconductor 4 is provided on said structure. When the photoconductor 4 is exposed to light, a current flows through the photoconductor 4 in the region of the exposed zone 10 between each time two electrodes of the interdigitated structure which are connected to the two terminals of the voltage and current source 7', respectively. In the same manner as already described above, a local heating of the magneto-optic material 2 is thus obtained. Other electrode forms are of course feasible within the scope of the described embodiments.

In order to enable a reading out of the stored information by means of the Faraday effect in transmission, the photoconductor 4 must pass the irradiated light at least partly. When using non-transparent photoconductors, the magnetization condition can be established optically in reflection by means of the Kerr effect. Both partly transparent and non-transparent photoconductors are therefore useful in principle.

As explained above, within the scope of the invention there is thus available, besides light and magnetic field, a third control parameter as a result of which another degree of freedom, in particular with respect to a block-wise optical addressing, is obtained.

What is claimed is:

1. An information storage device comprising a storage plate of a magnetizable material, means including a light beam for recording and retrieving information in said storage plate, a photoconductive layer on the magneto-optic material of the storage plate, and electrode means on said photoconductive layer, said electrode means being connected to an electrical power source to heat said layer.

2. A device as claimed in claim 1, wherein the electrodes are transparent and the photoconductive layer is disposed between the transparent electrodes.

3. A device as claimed in claim 1, wherein the electrodes are positioned only on one surface of the photoconductive layer.

4. A device as claimed in claim 1 wherein the magneto-optic material is iron garnet having a domain formation.

5. A device as claimed in claim 1 wherein the photoconductive layer is transparent.

6. A device as claimed in claim 1 wherein the photoconductive layer is not transparent and the surface of the magneto-optic material remote from the photoconductive layer is reflecting.

7. A device as claimed in claim 3 wherein the electrodes are positioned on a surface of the photoconductive layer facing the magneto-optic material.

8. A device as claimed in claim 1 wherein the photoconductive layer is cadmium sulfide.

9. A device as claimed in claim 4 wherein said magneto-optic material is a bismuth substituted ferrimagnetic garnet.

10. A device as claimed in claim 1 wherein said light beam is a laser beam.

* * * * *